(12) United States Patent
Sameshima (10) Patent No.: US 6,424,049 B1
(45) Date of Patent: Jul. 23, 2002

(54) SEMICONDUCTOR DEVICE HAVING CHIP-ON-CHIP STRUCTURE AND SEMICONDUCTOR CHIP USED THEREFOR

(75) Inventor: Katsumi Sameshima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/511,107

(22) Filed: Feb. 23, 2000

(30) Foreign Application Priority Data

Feb. 23, 1999 (JP) .......................................... 11-045213

(51) Int. Cl.$^7$ .............................................. H01L 29/40
(52) U.S. Cl. ..................................... 257/777; 257/686
(58) Field of Search ................................ 257/686, 777, 257/784

(56) References Cited

U.S. PATENT DOCUMENTS 5,818,748 A * 10/1998 Bertin et al. ................... 365/51

* cited by examiner

Primary Examiner—Roy Potter
(74) Attorney, Agent, or Firm—Rader, Fishman & Grauer, PLLC (57) ABSTRACT

A semiconductor device having a chip-on-chip structure. The device includes a first semiconductor chip having a connecting portion provided on its surface, a second semiconductor chip overlapped with and jointed to the surface of the first semiconductor chip and having a connecting portion provided on its surface opposite to the first semiconductor chip, and a deformable interlinkage for linking the connecting portion in the first semiconductor chip and the connecting portion in the second semiconductor chip together. The interlinkage may includes a connecting projection having flexibility provided in a standing condition on a vertex surface of the connecting portion in at least one of the first semiconductor chip and the second semiconductor chip.

9 Claims, 7 Drawing Sheets

SEMICONDUCTOR DEVICE HAVING CHIP-ON-CHIP STRUCTURE AND SEMICONDUCTOR CHIP USED THEREFOR

BACKGROUND OF THE INVENTION

1. Field of the Invention

The present invention relates to a semiconductor device having a chip-on-chip structure in which semiconductor chips are joined to each other by overlapping one of the semiconductor chips with the surface of the other semiconductor chip, and a semiconductor chip used therefor.

2. Description of Related Art

An example of a structure for miniaturizing and increasing the integration density of a semiconductor device is a so-called chip-on-chip structure in which paired semiconductor chips are overlapped with and joined to each other such that their surfaces are opposite to each other. In the chip-on-chip structure, a plurality of bumps are provided as a connecting portion on the surface of each of the semiconductor chips, and the bumps in the opposite semiconductor chips are joined to each other, to achieve electrical connection between the semiconductor chips.

The plurality of bumps can be formed in a state where they are raised from a surface protective film by selectively subjecting the surface protective film to plating using a material composing the bumps, for example. When the plurality of bumps are formed by the plating, however, the plurality of bumps formed on the surface protective film may, in some cases, vary in height depending on circumstances where the material composing the bumps is deposited.

In a case where the plurality of bumps in one of the semiconductor chips vary in height, when the semiconductor chip is joined to the other semiconductor chip, the low bump is not connected to the bump provided on the other semiconductor chip. Accordingly, electrical connection between the semiconductor chips may not be established in an area where the bumps are not connected to each other.

SUMMARY OF THE INVENTION

An object of the present invention is to provide a semiconductor device having a chip-on-chip structure capable of reliably connecting semiconductor chips even if connecting portions in the semiconductor chips vary in height.

Another object of the present invention is to provide semiconductor chips for a semiconductor device of a chip-on-chip type capable of reliably connecting the semiconductor chips.

A semiconductor device according to the present invention comprises a first semiconductor chip having a connecting portion provided on its surface; a second semiconductor chip overlapped with and jointed to the surface of the first semiconductor chip and having a connecting portion provided on its surface opposite to the first semiconductor chip; and a deformable interlinkage for linking the connecting portion in the first semiconductor chip and the connecting portion in the second semiconductor chip together.

It is preferable that the connecting portions are respectively bumps formed in a raised state on the surfaces of the first semiconductor chip and the second semiconductor chip.

According to the present invention, even if the connecting portion in the first semiconductor chip and the connecting portion in the second semiconductor chip vary in height, the variation in the height can be absorbed by the deformation of the interlinkage when the first semiconductor chip and the second semiconductor chip are joined to each other. Consequently, it is possible to reliably connect the first semiconductor chip and the second semiconductor chip to each other.

It is preferable that the interlinkage comprises a connecting projection having flexibility provided in a standing condition on a vertex surface of the connecting portion in at least one of the first semiconductor chip and the second semiconductor chip.

According to the construction, when the first semiconductor chip and the second semiconductor chip are joined to each other, the connecting projection is deformed upon being brought into contact with the connecting portion in the opposite semiconductor chip, thereby making it possible to absorb the variation in the height of the connecting portions.

Furthermore, the interlinkage may comprise a flexible portion formed by giving flexibility to a vertex of the connecting portion in at least one of the first semiconductor chip and the second semiconductor chip.

According to the construction, when the first semiconductor chip and the second semiconductor chip are joined to each other, the flexible portion provided in the connecting portion in at least one of the semiconductor chips is deformed upon being brought into contact with the connecting portion in the other semiconductor chip, thereby making it possible to absorb the variation in height of the connecting portions.

The flexible portion may be a vertex of the connecting portion which is given flexibility by being formed in a tapered shape (an approximate cone or pyramid).

The interlinkage may comprise a recess formed on a vertex surface of the connecting portion in the first semiconductor chip or the second semiconductor chip.

According to the construction, the first semiconductor chip and the second semiconductor chip can be satisfactorily aligned with each other by inserting a front end of the connecting portion or the connecting projection into the recess to form a projection-dent coupling between the front end of the connecting portion or the connecting projection and the recess.

It is preferable that a low-melting metal having a lower melting point than that of a material composing the connecting portion is embedded in the recess. Consequently, it is possible to connect the front end of the connecting portion or the connecting projection which is inserted into the recess to the connecting portion having the recess formed therein through the low-melting metal in the recess. Consequently, it is possible to more reliably connect the first semiconductor chip and the second semiconductor chip to each other.

It is preferable that the interlinkage comprises a melting interlinkage which is provided in a standing condition on a vertex surface of at least one of the connecting portions in the first semiconductor chip and the second semiconductor chip and is composed of a low-melting metal having a lower melting point than that of a material composing the connecting portion.

According to the construction, when the first semiconductor chip and the second semiconductor chip are pressed against each other with the melting interlinkage abutted against the connecting portion, the connecting projection or the melting interlinkage in the opposite semiconductor chip while applying heat to their abutted portion, the melting interlinkage is melted and deformed by the heating. The connecting portion in the first semiconductor chip and the connecting portion in the second semiconductor chip are linked together by the deformed melting interlinkage. Even if the connecting portions vary in height, therefore, the variation in the height can be absorbed by the melting and the deformation of the melting interlinkage. Accordingly, the first semiconductor chip and the second semiconductor chip can be reliably connected to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
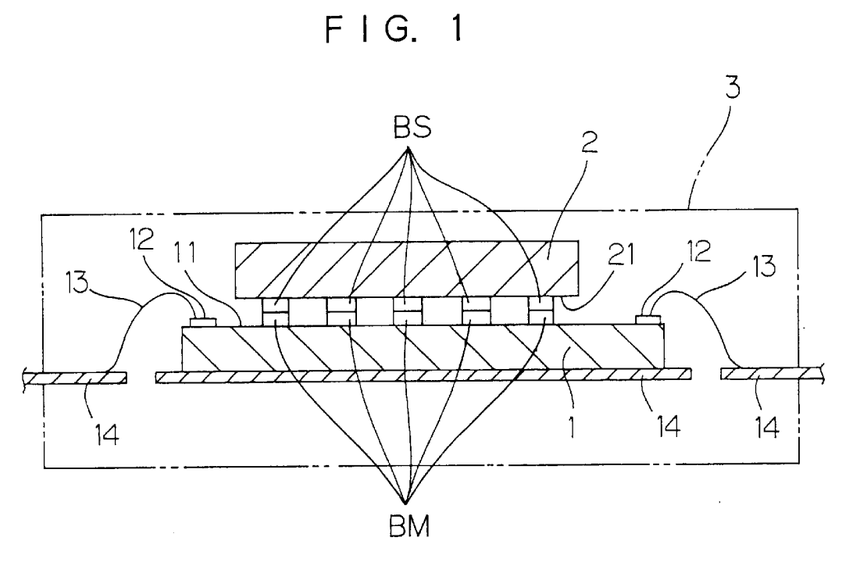
FIG. 1 is an illustrative cross-sectional view showing the schematic construction of a semiconductor device according to an embodiment of the present invention.

FIG. 1 is an illustrative cross-sectional view showing the schematic construction of a semiconductor device according to an embodiment of the present invention. The semiconductor device has a so-called chip-on-chip structure, and is constructed by overlapping and joining a daughter chip or secondary chip 2 with and to a surface 11 of a mother chip or primary chip 1 and then containing the chips in a package 3.

The primary chip 1 and the secondary chip 2 are formed of a silicon chip, for example. The surface of the primary chip 1 is an active layer side surface, where a functional device such as a transistor is formed, on a semiconductor substrate serving as a base body of the primary chip 1. A plurality of pads 12 for external connection are arranged in the vicinities of peripheral edges of the surface 11. The pad 12 for external connection is connected to a lead frame 14 by a bonding wire 13. A plurality of bumps BM for electrical connection to the secondary chip 2 are arranged on the surface 11 of the primary chip 1.

The secondary chip 2 is joined to the primary chip 1 by a so-called face-down system in which its surface 21 is opposed to the surface 11 of the primary chip 1. The surface 21 of the secondary chip 2 is an active layer side surface, where a functional device such as a transistor is formed, on a semiconductor substrate serving as a base body of the secondary chip 2. On the surface 21 of the secondary chip 2, a plurality of bumps BS connected to internal wiring are respectively arranged opposite to the bumps BM on the primary chip 1. The secondary chip 2 is supported above the primary chip 1 and is electrically connected to the primary chip 1 by respectively connecting the bumps BS to the opposite bumps BM on the primary chip 1.

Figure 2:
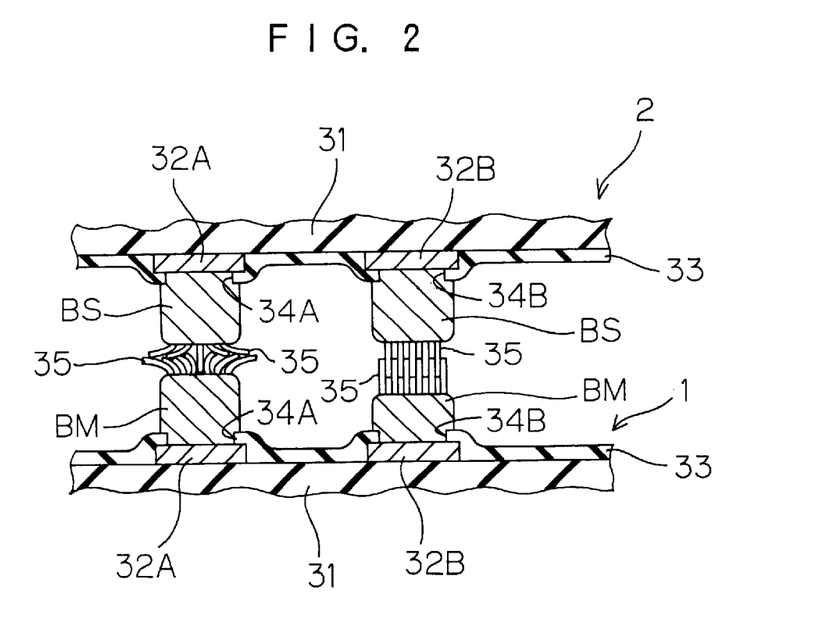
FIG. 2 is a cross-sectional view showing respective parts of a primary chip and a secondary chip in an enlarged manner.
Figure 3:
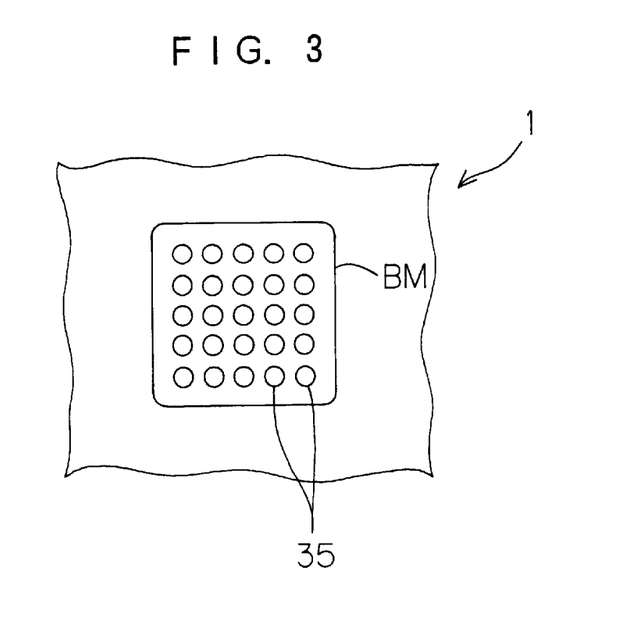
FIG. 3 is a plan view for explaining an example of the construction of a connecting projection.

FIG. 2 is a cross-sectional view showing respective parts of the primary chip 1 and the secondary chip 2 in an enlarged manner. FIG. 3 is a plan view showing the part of the primary chip 1 in an enlarged manner.

In the present embodiment, construction relating to the bumps BM in the primary chip 1 and construction relating to the bumps BS in the secondary chip 2 are substantially the same. Accordingly, description will be made, centered with respect to the construction of the primary chip 1. In FIG. 2, portions of the secondary chip 2 are respectively assigned the same reference numerals as those assigned to corresponding portions of the primary chip 1.

An interlayer insulating film 31 composed of silicon oxide, for example, is formed on a semiconductor substrate (not shown) forming a base body of the primary chip 1, and internal wirings 32A and 32B are disposed on the interlayer insulating film 31. The respective surfaces of the interlayer insulating film 31 and the wirings 32A and 32B are covered with a surface protective film 33 composed of silicon nitride, for example. The surface protective film 33 is provided with openings 34A and 34B with the openings respectively facing the wirings 32A and 32B.

The bump BM is composed of an oxidation-resistant metal such as gold, platinum, silver, palladium, or iridium. The bump BM is formed in a raised state on each of the wirings 32A and 32B exposed from the surface protective film 33 through the openings 34A and 34B. A plurality of connecting projections 35 composed of the same metal as that composing the bump BM are provided in a standing condition on a vertex surface of the bump BM. The connecting projection 35 has flexibility by being formed in the shape of a long narrow cylinder, for example.

The bump BM and the connecting projections 35 can be formed by a photolithographic technique, for example. That is, the openings 34A and 34B are formed in the surface protective film 33, and a resist pattern is selectively formed on the surface protective film 33 outside the openings 34A and 34B, followed by plating using the material composing the bump BM. Consequently, it is possible to form the bump BM on each of the wirings 32A and 32B exposed through the openings 34A and 34B. A new resist pattern having an opening corresponding to a plane pattern of the connecting projections 35 is formed on the vertex surface of the bump BM, followed by plating using the material composing the connecting projection 35. Consequently, the plurality of connecting projections 35 can be formed on the bump BM.

The plurality of connecting projections 35 are provided on each of the bumps BM and BS, thereby making it possible to reliably connect the bumps BM and BS to each other. In FIG. 2, an example in which the bump BM on the wiring 32A is formed at a height which is not less than a desired height is shown. In this case, the connecting projections 35 on the bump BM and the connecting projections 35 on the opposite bump BS are crushed against each other, so that the bump BM and the bump BS are connected to each other through the crushed connecting projections 35. In FIG. 2, an example in which the bump BM on the wiring 32B is formed at a height which is less than the desired height is shown. In this case, between front ends of the plurality of connecting projections 35 on the bump BM, a front end of the connecting projection on the opposite bump BS is inserted. The connecting projections 35 on the bump BM and the connection projections 35 on the bump BS are brought into contact with each other in an engaged state, so that the bump BM and the bump BS are connected to each other.

As described in the foregoing, according to the present embodiment, the connecting projections 35 having flexibility are provided on each of the bumps BM and BS. Even if the bumps BM and BS vary in height, therefore, the bump BM and the bump BS can be reliably connected to each other. Accordingly, the primary chip 1 and the secondary chip 2 can be reliably electrically connected to each other.

Figure 4:
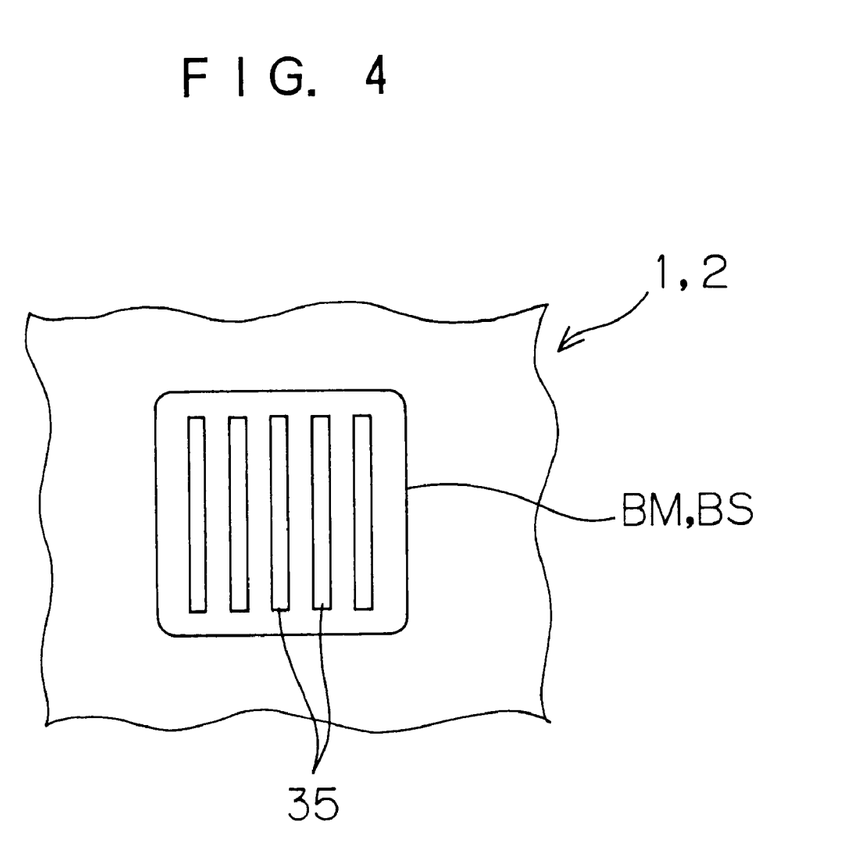
FIG. 4 is a plan view for explaining another example of the construction of a connecting projection.

Although in the present embodiment, the connecting projection 35 is formed in the shape of a long narrow cylinder, it may be formed in the shape of a long narrow prism. Further, the connecting projection 35 is not limited to one formed in the shape of a long narrow cylinder. For example, the connecting projection 35 may be constituted by a plurality of thin plate-shaped members which are provided in a standing condition on a vertex surface of each of the bumps BM and BS, as shown in FIG. 4, provided that it is easily deformable at the time of joining the primary chip 1 and the secondary chip 2.

Furthermore, although the connecting projection 35 is composed of the same material as that composing the bumps BM and BS, it may be composed of a material different from that composing the bumps BM and BS. For example, the connecting projection 35 may be composed of a metal material having a relatively low melting point, for example, a tin series alloy or a lead series alloy.

Although in the present embodiment, the connecting projections 35 are provided in a standing condition on the vertex surface of each of the bumps BM and BS, the connecting projections 35 may be provided in a standing condition on the vertex surface of only one of the bumps BM and BS. The bump BM and the bump BS may be connected to each other by bringing the connecting projections 35 on one of the bumps BM and BS into contact with the vertex surface of the other bump.

Figure 5:
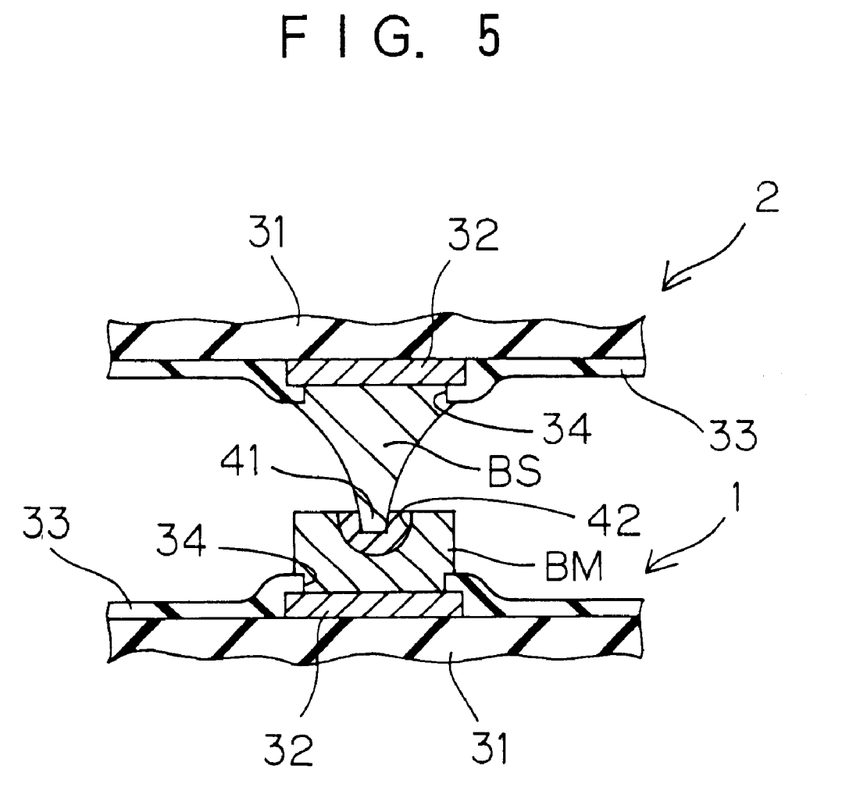
FIG. 5 is a cross-sectional view showing a part of a semiconductor device according to a second embodiment of the present invention in an enlarged manner.

FIG. 5 is a cross-sectional view showing a part of a semiconductor device according to a second embodiment of the present invention in an enlarged manner. In FIG. 5, portions corresponding to the portions shown in FIG. 2 are assigned the same reference numerals as those shown in FIG. 2.

In the second embodiment, the shape of a bump BM in a primary chip 1 and the shape of a bump BS in a secondary chip 2 differ from each other. The bump BM in the primary chip 1 is formed in a cylindrical shape using an oxidation-resistant metal on wiring 32 exposed from a surface projective film 33 through an opening 34. On the other hand, the bump BS in the secondary chip 2 is provided on wiring 32 exposed from a surface protective film 33 through an opening 34, and is formed in a tapered shape (an approximate cone or pyramid) using an oxidation-resistant metal, so that a vertex 41 is given flexibility.

A recess 42 into which a front end of the bump BS can be inserted is formed on a vertex surface of the bump BM. A metal having a relatively low melting point, for example, a tin series alloy or a lead series alloy, is embedded in the recess 42.

Connection between the primary chip 1 and the secondary chip 2 is achieved by pressing the primary chip 1 and the secondary chip 2 against each other with the vertex 41 of the bump BS abutted against the low-melting metal in the recess 42 in the opposite bump BM while applying heat to an abutted area of the bumps BM and BS. The low-melting metal in the recess 42 in the bump BM is melted by the heating, so that the vertex 41 of the bump BS enters the recess 42. For example, when the bumps BS and BM are respectively formed at heights which are not less than a desired height, the vertex 41 of the bump BS is crushed upon being abutted against a bottom surface of the recess 42. Consequently, the primary chip 1 and the secondary chip 2 are connected to each other with predetermined spacing. When the bumps BM and BS are respectively formed at heights which are less than the desired height, the vertex 41 of the bump BS enters the recess 42. The low-melting metal in the recess 42 and the bump BS are connected to each other, to achieve electrical connection between the primary chip 1 and the secondary chip 2.

As described in the foregoing, according to the present embodiment, even when the bumps BM and BS vary in height, as in the above-mentioned first embodiment, the primary chip 1 and the secondary chip 2 can be reliably electrically connected to each other.

The vertex 41 of the bump BS enters the recess 42 in the bump BM, thereby forming a projection-dent coupling between the bump BM and the bump BS. Accordingly, the primary chip 1 and the secondary chip 2 can be satisfactorily aligned with each other.

Each of the bump BM and the bump BS can be formed by subjecting the surface protective film 33 having the opening 34 formed therein to selective plating, selectively depositing a material composing the bump on the wiring 32 exposed through the opening 34, and then etching a deposit obtained.

Figure 6A:
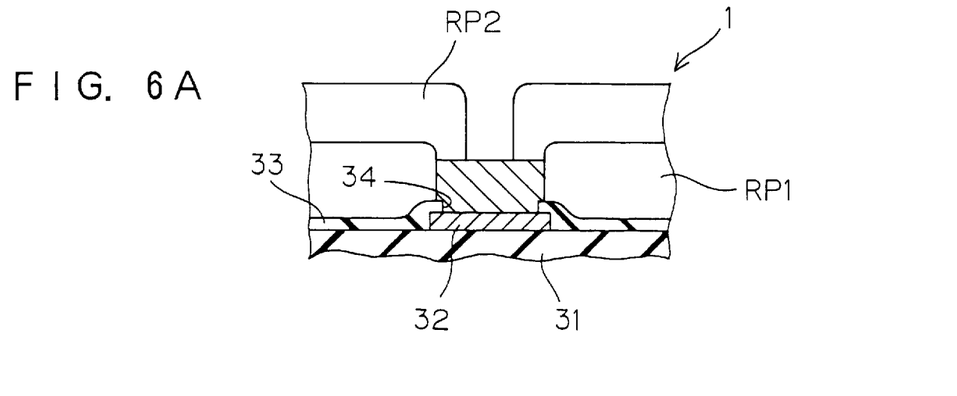
FIGS. 6A, 6B, and 6C are cross-sectional views for explaining a method of forming a bump in a primary chip.
Figure 6B:
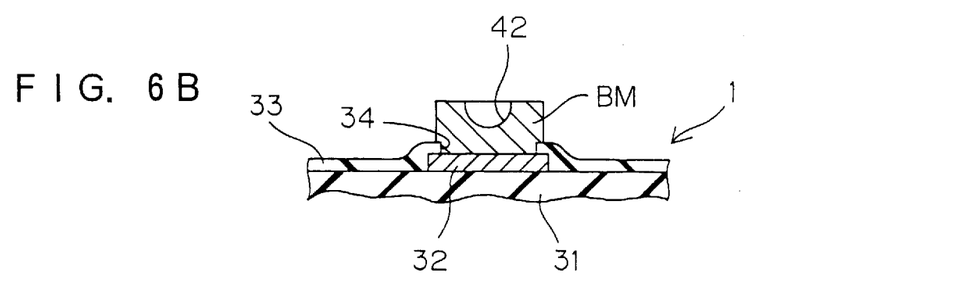
Figure 6C:
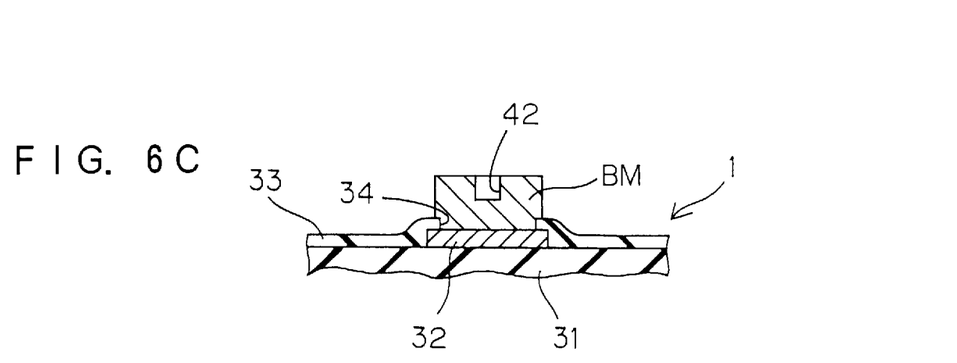

For example, a resist pattern RP1 is selectively formed on the surface protective film 33 having the opening 34 formed therein, followed by plating using the material composing the bump BM, thereby to deposit the material composing the bump BM on the wiring 32 exposed through the opening 34, as shown in FIG. 6A. Thereafter, a resist pattern RP2 having an opening corresponding to an area where the recess 42 should be formed, and the deposit on the wiring 32 is etched using the resist pattern RP2 as a mask, thereby making it possible to form the bump BM having the recess 42. The shape of the recess 42 differs depending on the type of etching. When wet etching is performed, a recess 42 having a bottom surface in a mortar shape is formed, as shown FIG. 6B. On the other hand, when dry etching is performed, a recess 42 having an approximately flat bottom surface is formed, as shown in FIG. 6C.

Figure 7A:
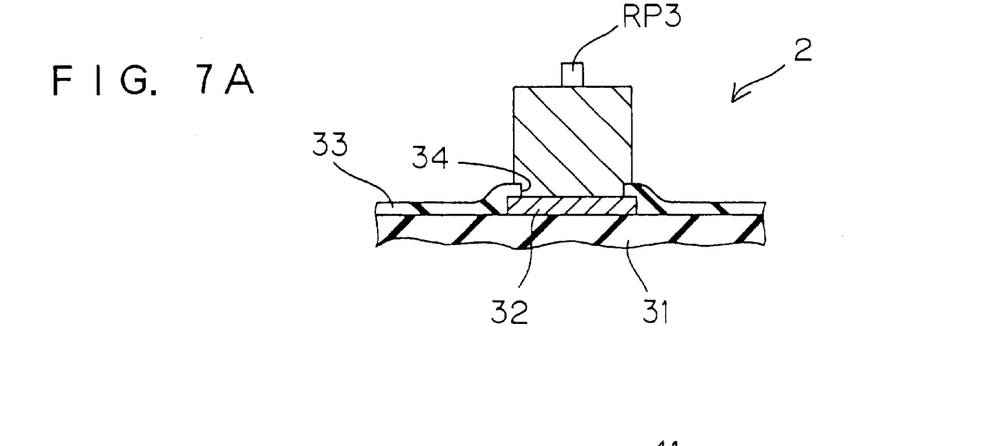
FIGS. 7A, 7B, and 7C are cross-sectional views for explaining a method of forming a bump in a secondary chip.
Figure 7B:
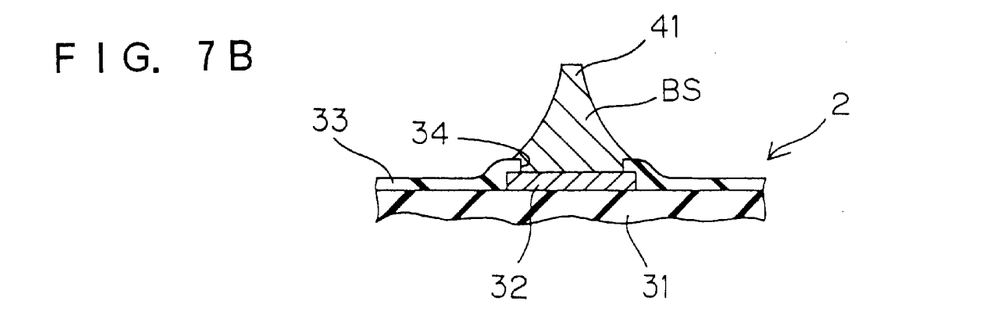
Figure 7C:
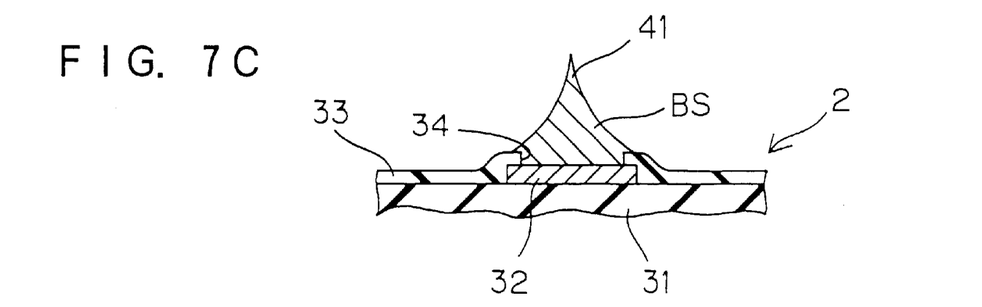

As shown in FIG. 7A, the material composing the bump BM is deposited on the wiring 32 exposed through the opening 34, a very small resist pattern RP3 is then stacked on an upper surface of a deposit obtained, and etching is performed using the resist pattern RP3 as a mask, thereby making it possible to form a bump BS in a tapered shape (an approximate cone or pyramid). The shape of the bump BS differs depending on the type of etching. When wet etching is performed, a bump BS in a tapered shape having an approximately flat vertex surface is formed in an area in contact with the resist pattern RP3, as shown in FIG. 7B. On the other hand, when dry etching is performed to simultaneously etch the resist pattern RP3, a bump BS in a tapered shape having a pointed vertex 41 is formed, as shown in FIG. 7C.

Although in the second embodiment, the recess 42 is formed in the bump BM in the primary chip 1, and the bump BS in the secondary chip 2 is formed in a tapered shape (an approximately cone or pyramid), the bump BM in the primary chip 1 may be formed in a tapered shape, and the recess 42 may be formed in the bump BS in the secondary chip 2.

The recess 42 need not be necessarily formed in the bump BM or the bump BS. The bump BM and the bump BS may be connected to each other by respectively bringing one of the bumps BM and BS formed in a tapered shape into contact with flat vertex surfaces of the other of the bumps BS and BM.

Figure 8A:
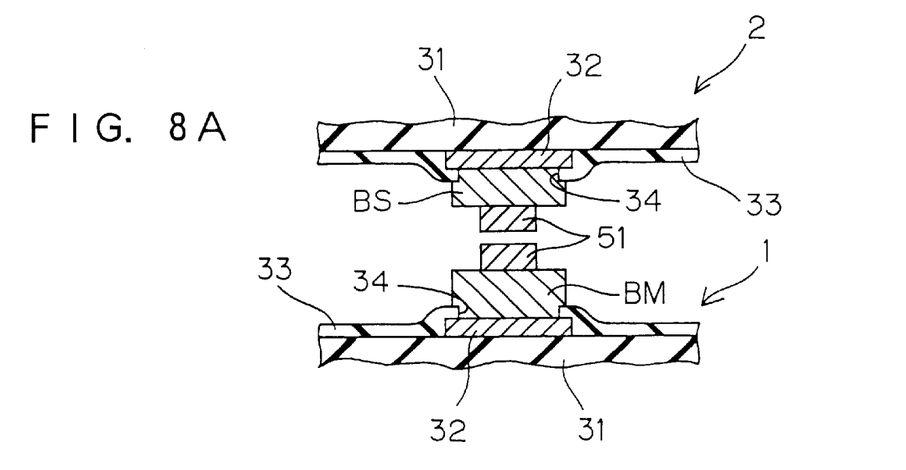
FIGS. 8A and 8B are cross-sectional views showing a part of a semiconductor device according to a third embodiment of the present invention in an enlarged manner.
Figure 8B:
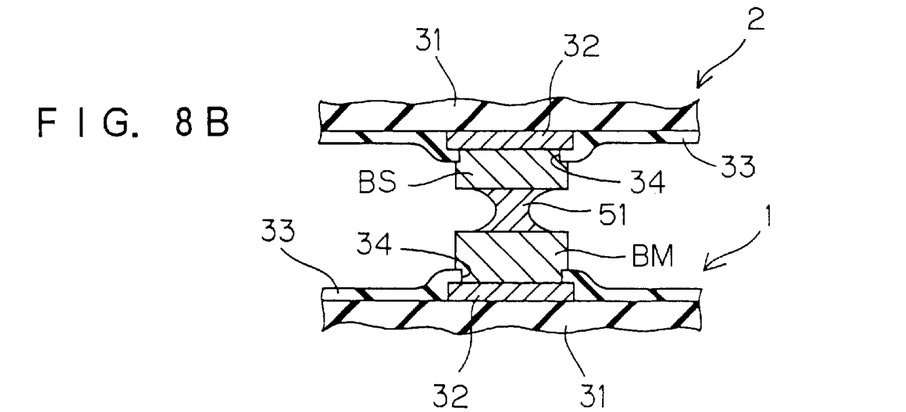

FIGS. 8A and 8B are cross-sectional views showing a part of a semiconductor device according to a third embodiment of the present invention in an enlarged manner. In FIGS. 8A and 8B, portions corresponding to the portions shown in FIG. 2 are assigned the same reference numerals as those shown in FIG. 2.

In the third embodiment, melting interlinkages in a projection shape are respectively provided on vertex surfaces of bumps BM and BS. The melting interlinkage 51 is composed of a metal having a relatively low melting point, for example, a tin series alloy or a lead series alloy, and can be formed by forming the bump BM or BS on wiring 32 exposed through an opening 34, then stacking a resist pattern having an opening corresponding to an area where the melting interlinkage 51 should be formed, and depositing a material composing the melting interlinkage 51 by plating on the vertex surfaces of the bump exposed through the opening of the resist pattern, for example.

A primary chip 1 and a secondary chip 2 are pressed against each other with the melting interlinkage 51 on the bump BS abutted against the melting interlinkage 51 on the bump BM while applying heat to an abutted area of the bumps BM and BS. Accordingly, the melting interlinkages 51 between the bumps BM and BS are melted and deformed by the heating, and the deformed melting interlinkages 51 are connected to each other by surface tension, as shown in FIG. 8B. Consequently, the bump BM and the bump BS are connected to each other. Even if the bumps BM and BS vary in height, therefore, the variation in the height can be absorbed by the melting and the deformation of the melting interlinkages 51. Accordingly, the primary chip 1 and the secondary chip 2 can be reliably electrically connected to each other.

Although in the third embodiment, the melting interlinkage 51 is formed on the vertex surface of each of the bumps BM and BS, the melting interlinkage 51 may be formed on the vertex surface of only one of the bumps BM and BS.

The melting interlinkage 51 is not limited to one in a projection shape. For example, it may be one in a film shape formed by applying a cream solder, a conductive paste, or the like to almost the entire area of the vertex surface of each of the bumps BM and BS.

Although description has been made of some embodiments of the present invention, the present invention is not limited to the above-mentioned embodiments. Although both the primary chip 1 and the secondary chip 2 are chips composed of silicon, they may be semiconductor chips using an arbitrary semiconductor material such as a compound semiconductor (for example, a gallium arsenic semiconductor) or a germanium semiconductor in addition to silicon. A semiconductor material for the primary chip 1 and a semiconductor material for the secondary chip 2 may be the same as or different from each other.

Although the present invention has been described and illustrated in detail, it is clearly understood that the same is by way of illustration and example only and is not to be taken by way of limitation, the spirit and scope of the present invention being limited only by the terms of the appended claims.

This application claims priority benefits under USC § 119 of Japanese Patent Application No. 11-45213 filed with the Japanese Patent Office on Feb. 23, 1999, the disclosure of which is incorporated hereinto by reference.

What is claimed is:

1. A semiconductor device having a chip-on-chip structure comprising:
   a first semiconductor chip having a connecting portion provided on its surface;
   a second semiconductor chip overlapped with and jointed to the surface of the first semiconductor chip and having a connecting portion provided on its surface opposite to the first semiconductor chip; and
   a deformable interlinkage for linking the connecting portion in the first semiconductor chip and the connecting portion in the second semiconductor chip together,
   the interlinkage including a flexible connecting projection provided in a standing condition directly on a vertex surface of the connecting portion in at least one of the first semiconductor chip and the second semiconductor chip.

2. A semiconductor device having a chip-on-chip structure, comprising:
   a first semiconductor chip having a connecting portion provided on its surface;
   a second semiconductor chip overlapped with and jointed to the surface of the first semiconductor chip and having a connecting portion provided on its surface opposite to the first semiconductor chip; and
   a deformable interlinkage for linking the connecting portion in the first semiconductor chip and the connecting portion in the second semiconductor chip together, the connecting portion of at least one of the first and second semiconductor chips being formed in a tapered-shape to give flexibility to a vertex thereof;
   the deformable interlinkage including a tapered-shape flexible portion at the vertex.

3. A semiconductor device having a chip-on-chip structure, comprising:
   a first semiconductor chip having a first connecting portion provided on its surface;
   a second semiconductor chip overlapped with and jointed to the surface of the first semiconductor chip and having a second connecting portion provided on its surface opposite to the first semiconductor chip; and
   a deformable interlinkage for linking the first connecting portion and the second connecting portion;
   one of the first and second connecting portions having a recess formed on a vertex thereof for receiving a vertex of the other of the first and second connecting portions;
   the deformable interlinkage including a deformable metal placed in the recess.

4. A semiconductor device having a chip-on-chip structure, comprising:
   a first semiconductor chip having a first connecting portion provided on its surface;
   a second semiconductor chip overlapped with and jointed to the surface of the first semiconductor chip and having a second connecting portion provided on its surface opposite to the first semiconductor chip; and
   a deformable interlinkage for linking the first connecting portion and the second connecting portion;
   one of the first and second connecting portions having a recess formed on a vertex thereof for receiving a vertex of the other of the first and second connecting portions;
   the deformable interlinkage including a deformable metal place in the recess, wherein the metal has a lower melting point than that of a material composing the connecting portion and is embedded in the recess.

5. A semiconductor device having a chip-on-chip structure, comprising:
   a first semiconductor chip having a connecting portion provided on its surface;
   a second semiconductor chip overlapped with and jointed to the surface of the first semiconductor chip and having a connecting portion provided on its surface opposite to the first semiconductor chip; and
   a deformable interlinkage for linking the connecting portion in the first semiconductor chip and the connecting portion in the second semiconductor chip together, wherein
   the interlinkage includes a melting interlinkage which is provided in a standing condition on a vertex surface of at least one of the connecting portions in the first semiconductor chip and the second semiconductor chip and is composed of a low-melting metal having a lower melting point than that of a material composing the connecting portion.

6. A semiconductor chip having a connecting portion for electrical connection to another solid device on its surface, wherein
   a deformable interlinkage is provided in an area, which is joined to the solid device, in the connecting portion, wherein
   the interlinkage includes a flexible connecting projection provided in a standing condition directly on a vertex surface of the connecting portion.

7. A semiconductor chip having a connecting portion for electrical connection to another solid device on its surface, wherein
   a deformable interlinkage is provided in an area, which is joined to the solid device;
   the deformable interlinkage including a flexible portion which is the connecting portion formed in a tapered-shape to give flexibility to a vertex thereof.

8. A semiconductor chip having a connecting portion for electrical connection to another solid device on its surface, wherein
   a deformable interlinkage is provided in an area, which is joined to the solid device, in the connecting portion, wherein
   the interlinkage includes a low-melting metal, having a lower melting point than that of a material composing the connecting portion, embedded in a recess formed on a vertex surface of the connecting portion.

9. A semiconductor chip having a connecting portion for electrical connection to another solid device on its surface, wherein
   a deformable interlinkage is provided in an area, which is joined to the solid device, in the connecting portion, wherein
   the interlinkage includes a melting interlinkage which is provided in a standing condition on a vertex surface of the connecting portion and is composed of a low-melting metal having a lower melting point than that of a material composing the connecting portion.

* * * * *